(12) United States Patent
Gitzinger et al.

(10) Patent No.: US 7,924,175 B2
(45) Date of Patent: Apr. 12, 2011

(54) OPTICAL KEYPAD FOR ELECTRONIC DEVICE

(75) Inventors: Thomas E. Gitzinger, Libertyville, IL (US); Rachid M. Alameh, Crystal Lake, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 1020 days.

(21) Appl. No.: 11/690,971

(22) Filed: Mar. 26, 2007

(65) Prior Publication Data

US 2008/0238725 A1     Oct. 2, 2008

(51) Int. Cl.
*H03M 11/00* (2006.01)

(52) U.S. Cl. .......... 341/31; 400/477; 241/22; 250/221; 250/229

(58) Field of Classification Search .............. 341/20, 341/22, 31; 400/477; 250/221, 229
See application file for complete search history.

(56) References Cited

U.S. PATENT DOCUMENTS

| | | | |
|---|---|---|---|
| 3,886,544 A * | 5/1975 | Narodny | 341/31 |
| 4,254,407 A * | 3/1981 | Tipon | 341/31 |
| 4,387,367 A * | 6/1983 | Fisher | 341/31 |
| 4,417,824 A * | 11/1983 | Paterson et al. | 400/477 |
| 4,480,184 A * | 10/1984 | Ely | 250/227.22 |
| 4,534,668 A * | 8/1985 | Hildel et al. | 400/477 |
| 4,713,535 A * | 12/1987 | Rhoades | 250/221 |
| 4,786,797 A * | 11/1988 | Ely | 250/214 R |
| 4,836,636 A * | 6/1989 | Obara et al. | 385/19 |
| 4,868,568 A * | 9/1989 | Souloumiac | 341/31 |
| 4,884,073 A * | 11/1989 | Souloumiac | 341/31 |
| 4,931,794 A * | 6/1990 | Haag et al. | 341/31 |
| RE33,422 E * | 11/1990 | Garcia, Jr. | 250/229 |
| 4,980,685 A * | 12/1990 | Souloumiac et al. | 341/31 |
| 5,218,967 A * | 6/1993 | Shinomiya et al. | 600/493 |
| 5,410,150 A * | 4/1995 | Teron et al. | 250/227.22 |
| 5,677,688 A | 10/1997 | O'Mara et al. | |
| 6,172,667 B1 * | 1/2001 | Sayag | 345/175 |
| 6,175,679 B1 * | 1/2001 | Veligdan et al. | 385/120 |
| 6,741,189 B1 | 5/2004 | Gibbons, II et al. | |
| 2003/0052257 A1 * | 3/2003 | Sumriddetchkajorn | 250/227.11 |
| 2005/0157971 A1 | 7/2005 | Juijve et al. | |
| 2005/0184885 A1 | 8/2005 | Tervonen et al. | |
| 2006/0152494 A1 * | 7/2006 | Liess | 345/169 |
| 2010/0060583 A1 * | 3/2010 | Yan | 345/166 |

* cited by examiner

*Primary Examiner* — Albert K Wong
(74) *Attorney, Agent, or Firm* — Hisashi D. Watanabe

(57) ABSTRACT

Disclosed in a wearable electronic device including an optical keypad supported by a keypad housing. The optical keypad may include a plurality of keys disposed along the keypad housing, and a plurality of illumination sources and optical receivers with a corresponding illumination source and optical receiver for each of the plurality of keys. The keypad signal interface may be limited to three connections, to provide a connection for power, a connection for ground, and a connection for data between the keypad housing and the main housing. The electronic device may also include at least one optical receiver configured to be optically coupled to at least one of the plurality of illumination sources, and configured to convert a received optical signal representing data into an electrical signal representing data. The illumination sources may provide optical signals during key presses, and may in addition provide key illumination for unpressed keys.

12 Claims, 8 Drawing Sheets

WEARABLE ELECTRONIC DEVICE

OPTICAL KEYPAD FOR ELECTRONIC DEVICE

FIELD

Disclosed is an electronic device including an optical keypad, and more particularly a wearable electronic device including an optical keypad slidably and/or rotatably attached to a main housing of the wearable electronic device.

BACKGROUND

The makers of mobile communication devices, including those of cellular telephones, are increasingly adding functionality to their devices. While there is a trend toward the inclusion of more features and improvements for current features, there is also a trend toward smaller mobile communication devices. For example, cellular telephones include features such as still and video cameras, video streaming and two-way video calling, email functionality, Internet browsers, music players, FM radios with stereo audio, and organizers. As mobile communication device technology has continued to improve, the devices have become increasingly smaller. Therefore, there may less surface area for placement of user interface (UI) components, such as standard keypads, as manufacturers continue to add features and reduce their products' size.

In a small wearable mobile communication device, such as a headset or an earmounted cellular telephone, manufacturers may use speech recognition for the primary UI to conserve surface area. However, a speech recognition UI may not be practical when there is substantial ambient noise or when the user prefers privacy. Therefore, it may be beneficial to supplement a speech recognition UI with a keypad. As mentioned, however, there may be limited surface area for a standard keypad.

DETAILED DESCRIPTION

Figure 1:
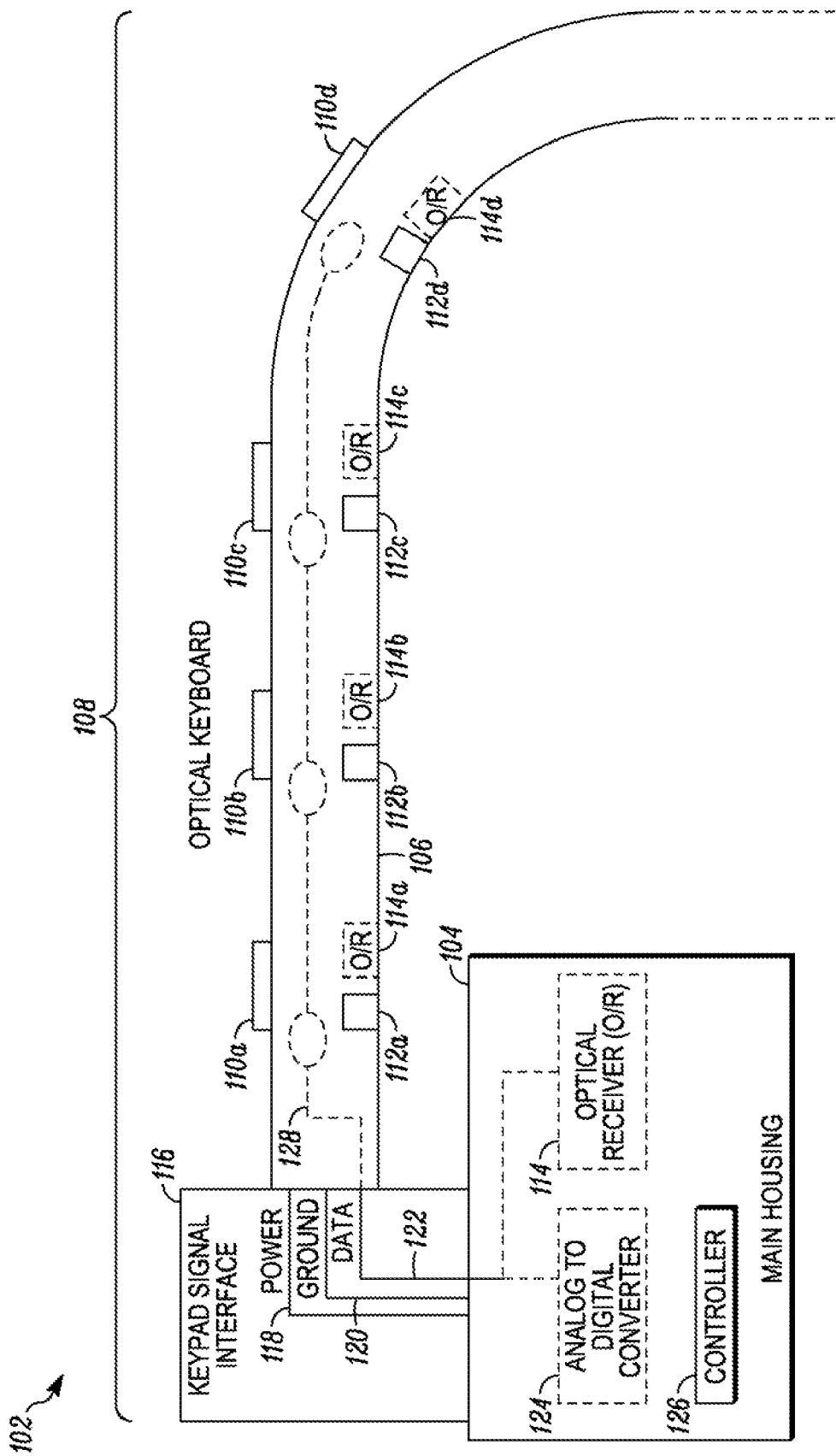
FIG. 1 depicts an embodiment of an electronic device that includes an optical keypad.

It may be beneficial to utilize non-traditional surface area for a keypad, particularly when the surface area of a device is limited. For example, in one embodiment, in an earmounted headset or cellular telephone, the linear or curvilinear earmount housing may support a keypad. In another embodiment, in an earmounted headset or cellular telephone, the linear or curvilinear microphone boom may support a keypad. A keypad in either of these particular embodiments may be linear. In either of these embodiments, the keypad is supported by a housing that is separate from but attached to the main housing. In this way, surface area of the device may be conserved. In such a configuration, it may be beneficial if the keypad signal interface were limited to, for example, three connections to simplify the electronics of the device. Fewer electronic connections may not only help reduce the size of the device but may also help reduce the cost of the device.

Disclosed is an electronic device including a main housing and a keypad housing attached to the main housing. The keypad housing may be capable of adjustment in position or orientation relative to the main housing, and may support an optical keypad. In one embodiment, the keypad housing may be an earmount for a wearable communication device. In another embodiment, the keypad housing may be a microphone boom. It is understood that any keypad housing attached to the main housing is within the scope of this discussion.

An optical keypad may be supported by the keypad housing. An optical keypad may include a plurality of keys disposed along the keypad housing, and a plurality of illumination sources with a corresponding illumination source for each of the plurality of keys. As mentioned above, it may be beneficial if the keypad signal interface were limited to three connections. A keypad signal interface of three connections may provide a connection for power, a connection for ground, and a connection for data between the keypad housing and the main housing. The electronic device may also include at least one optical receiver configured to be optically coupled to at least one of the plurality of illumination sources, and configured to convert a received optical signal representing data into an electrical signal representing data.

An optical keypad in a wearable electronic device may be beneficial over a standard or traditional keypad since the light of an optical keypad may be used for both illumination of the keys and for communication of data signals. In an optical keypad, a key press may be registered by detection of an optical signal by an optical receiver to produce data signals. In embodiments described herein, illumination sources may provide key illumination for unpressed keys and may in addition provide optical data signals during key presses reducing the number of components compared to a standard keypad. In one embodiment a key press may be effected without movement of mechanical parts. In another embodiment, a key press may effect deformation of a flexible optical guide which may be disposed in an earmount or microphone boom of the wearable electronic device. In these and other embodiments, a reduced number of mechanical components and/or use of non-traditional surface area may benefit a user by enabling a richer user interface, and also by enabling a wearable device with less weight and/or better weight distribution.

As mentioned above, in one embodiment the electronic device may be configured as a wearable electronic device, with the main housing of the electronic device supported by an earmount. The earmount may include the keypad housing so that the plurality of keys may be disposed along the curvilinear profile of the earmount so that the keys are in consecutive positions along the earmount. The earmount may be rotatably and detachably coupled to the main housing. The wearable electronic device may further include a keypad signal interface supported by the earmount, supported by a hinge, or supported by the main housing, and may include three connections, an electrical connection for power between the earmount and the housing, an electrical connection for ground between the earmount and the housing, and a connection for data between the earmount and the housing, configured to provide a data connection to the optical keypad.

As mentioned above, in another embodiment the plurality of keys may be disposed in a linear alignment along the boom, with the microphone mounted on a portion of the boom distal the main housing. The boom may be slidably coupled to the main housing so as to define a slide, and at least one key of the plurality of keys may be configured as a soft key to be activated according to a position of the slide with respect to the main housing. Similarly, the boom keypad housing may include a keypad signal interface of three connections.

In either of the above described embodiments, and of course any other embodiments, the optical keypad may be configured to receive multiple key presses at the same time. The illumination sources of the optical keypad may be configured to emit coded emissions. In an embodiment, the emissions may be coded according to intensity of illumination. An analog-to-digital (A/D) converter coupled to an optical receiver may provide digital output according to the intensity of illumination received by the optical receiver. In another embodiment, the emissions may be encoded according to a Time Division Multiplexing (TDM) scheme. In still another embodiment the emissions may be encoded according to a Frequency Division Multiplexing (FDM) scheme.

The instant disclosure is provided to explain in an enabling fashion the best modes of making and using various embodiments in accordance with the present invention. The disclosure is further offered to enhance an understanding and appreciation for the invention principles and advantages thereof, rather than to limit in any manner the invention. While the preferred embodiments of the invention are illustrated and described here, it is clear that the invention is not so limited. Numerous modifications, changes, variations, substitutions, and equivalents will occur to those skilled in the art having the benefit of this disclosure without departing from the spirit and scope of the present invention as defined by the following claims.

It is understood that the use of relational terms, if any, such as first and second, up and down, and the like are used solely to distinguish one from another entity or action without necessarily requiring or implying any actual such relationship or order between such entities or actions.

FIG. 1 depicts an embodiment of an electronic device 102 that includes a main housing 104 and a keypad housing 106 attached to the main housing 104. The main housing 104 may be referred to herein as a housing 104. The keypad housing such as that of an earmount or microphone boom may be adjustable in position or orientation relative to the main housing.

An optical keypad 108 may be supported by the keypad housing 106. The keypad housing 106 may have a linear or curvilinear profile. For example, an earmount typically has a curvilinear profile, while a microphone boom may have a linear profile. A plurality of keys 110a, 110b, 110c, and 110d may be disposed along the keypad housing 106 for example, consecutively. It is understood here and in the remainder of this disclosure that any suitable number of keys may be disposed along the keypad housing 106. It may be typical to include twelve (12) keys, 0-9, * and #, as usually included with a cellular telephone. It is understood that the optical keypad 108 in addition may include soft keys.

The wearable electronic device 102 may have limited surface area and may therefore include speech recognition capability as a primary user interface (UI) to conserve surface area. However, use of a speech recognition UI may not be practical when there is substantial ambient noise or when a user prefers privacy. An optical keypad 108 as disclosed herein may supplement a primary UI by providing for input via a keypad, or may be utilized as a primary UI.

It is understood that the wearable electronic device 102 may be implemented as a wireless communication device such as a cellular telephone (also called a mobile phone) or a headset or other type of ear worn device. The mobile communication device 102 represents a wide variety of devices that have been developed for use within various networks. Such communication devices include, for example, cellular telephones, messaging devices, personal digital assistants (PDAs), notebook or laptop computers incorporating communication modems, mobile data terminals, application specific gaming devices, video gaming devices incorporating wireless modems, and the like. Any of these portable devices may be referred to as a mobile station or user equipment. Herein, wireless communication technologies may include, for example, voice communication, the capability of transferring digital data, SMS messaging, Internet access, multimedia content access and/or voice over internet protocol (VoIP).

A plurality of illumination sources 112a, 112b, 112c, and 112d may be supported within the keypad housing 106, with a corresponding illumination source for each of the plurality of keys 110a, 110b, 110c, and 110d. In one embodiment the illumination sources may include light emitting diodes (LEDs). In another embodiment the illumination sources may include lasers, such as for example, Vertical-Cavity Surface-Emitting Lasers (VCSELs) or other semiconductor laser diodes. The illumination sources may be configured to have coded emissions. It is understood that any suitable illumination source may be employed. It is further understood that in an embodiment with more, or fewer, keys there may be correspondingly more or fewer illumination sources.

When a key is unpressed, its corresponding illumination source may illuminate the key to facilitate the user's locating the key, enriching the user's experience. Illumination of the key may also facilitate identifying the key's value, for example, '1', '2', '#', and so on. When a key is pressed, the corresponding illumination source may be configured to provide input to an optical receiver 114 to signal a key press. The optical receiver 114 is configured to be optically coupled to at least one of the plurality of illumination sources 112a, 112b, and is also configured to convert a received optical signal representing data into an electrical signal representing data. The data may be used to initiate communication by dialing a telephone number or may be used to activate a function or feature of the device 102. In this way, using the light for both illumination and data signals, the disclosed optical keypad may reduce the number of components compared to a standard keypad.

As mentioned, an illumination source may be configured to provide input to an optical receiver 114 to signal a key press. In this way an optical receiver may convert a received optical signal representing data into an electrical signal representing data. In an embodiment the optical receiver 114 may be a photodiode. In another embodiment the optical receiver may be a p-type-intrinsic-n-type (PIN) diode. It is understood that any suitable optical receiver may be utilized. In one embodiment, there may be a plurality of optical receivers 114a, 114b, 114c, and 114d, with a corresponding optical receiver for each key of the plurality of keys. In another embodiment, there may be a single optical receiver 114 configured to receive optical input that may signal a key press of any of the plurality of keys. It is understood that any number of optical receivers is within the scope of this discussion.

A keypad signal interface 116 may be supported by the keypad housing 106. The keypad signal interface 116 may include three connections. As mentioned, it may be beneficial if the keypad signal interface were limited to for example three connections to simplify the electronics of the device. First, an electrical connection 118 may provide power to the keypad housing 106 from the main housing 104. Second, an electrical connection 120 may provide a ground connection between the keypad housing 106 and the main housing 104. Third, a connection 122 may provide a data connection between the keypad housing 106 and the main housing 104. In this way fewer electronic connections may help reduce the size and cost of the device.

Different configurations are within the scope of this discussion. Looking ahead to FIG. 5, that figure shows an embodiment where each key 510a, 510b and so on, have their own optical receivers 514a and 514b respectively. Looking ahead to FIG. 8, that figure shows an embodiment where each key 810a, 810b and 810c and so on, share an optical receiver 114 (see FIG. 1) in the main housing. Returning to FIG. 1, this figure shows both of the embodiments of FIG. 5 and FIG. 8. That is, in the embodiment of FIG. 5, the data connection 122 may include an electrical connection between one or more optical receivers 114a, 114b in the keypad housing 106 and an analog-to-digital (A/D) converter 124 for example in the main housing 104. The electrical connection may be configured as a linear data line, so that when more than one optical receiver provides output to the linear data line, the outputs are summed to generate a summed output. The optical receivers may provide outputs in response to optical signals, and may be connected to the linear data line as just described. The A/D converter 124 may be coupled to a controller 126 and may provide to the controller digital data signaling one or more key presses.

Figure 8:
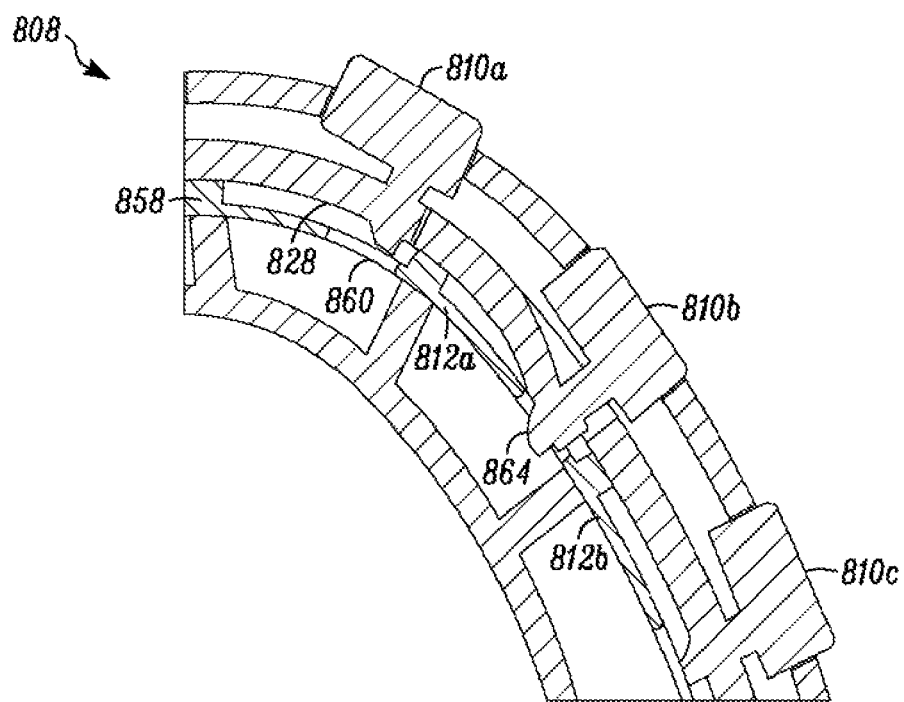
FIG. 8 depicts a cutaway view of a portion of the earmount of the embodiment of FIG. 4 showing details of keys and an optical guide.

In the embodiment of FIG. 8, the data connection 122 may include an optical guide 128 that may be configured to gather an optical signal from a corresponding illumination source 112a, for example, for each of the plurality of keys, for example, 110a. The optical guide 128 may be configured to conduct the optical signal to the main housing 104. In an embodiment an optical receiver 114 may be positioned in the main housing 104 and coupled to the optical guide 128. The optical receiver 114 may be coupled to the controller 126. In this way optical signals representing one or more key presses may be conducted from the keypad housing 106 to the optical receiver 114 in the main housing 104 and converted by the optical receiver into electrical data signals for processing by the controller 126.

As mentioned above, the keypad signal interface 116 providing communication between the keypad 108 and the main housing 104 may be supported by the keypad housing 106. It is understood that the keypad signal interface 116 may also be supported by the main housing 104. In another embodiment a keypad signal interface 116 may be supported by a hinge coupling the keypad housing 106 with the main housing 104.

Figure 2:
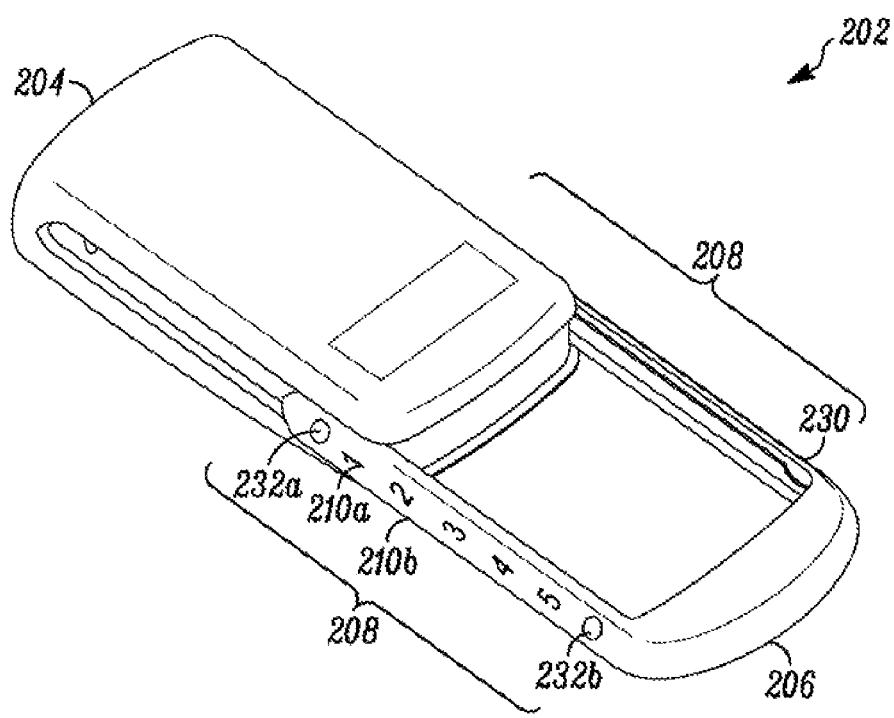
FIG. 2 depicts an embodiment of a wearable electronic device having a keypad integral with a slidable microphone boom.
Figure 3:
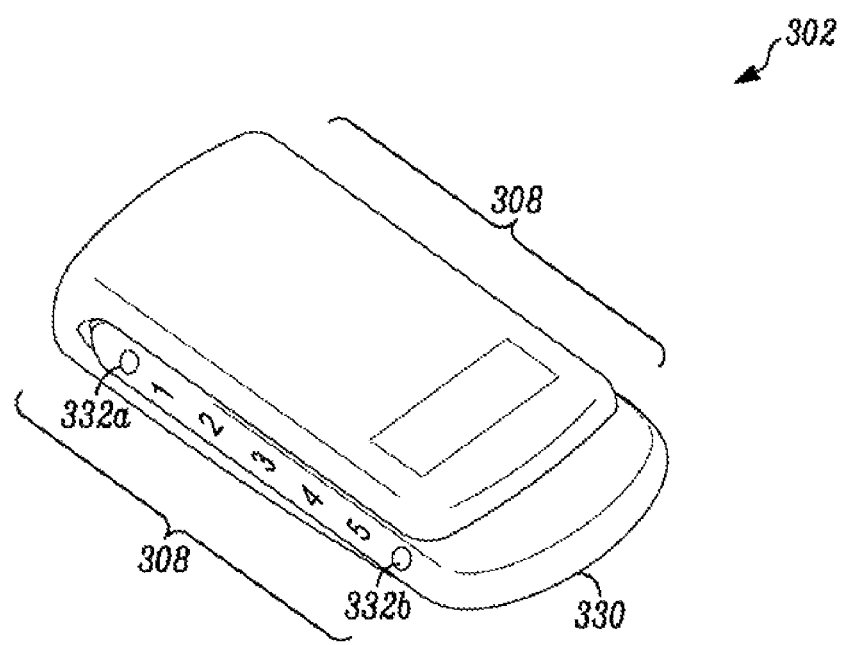
FIG. 3 depicts the embodiment of FIG. 2 showing the microphone boom in a retracted position.
Figure 4:
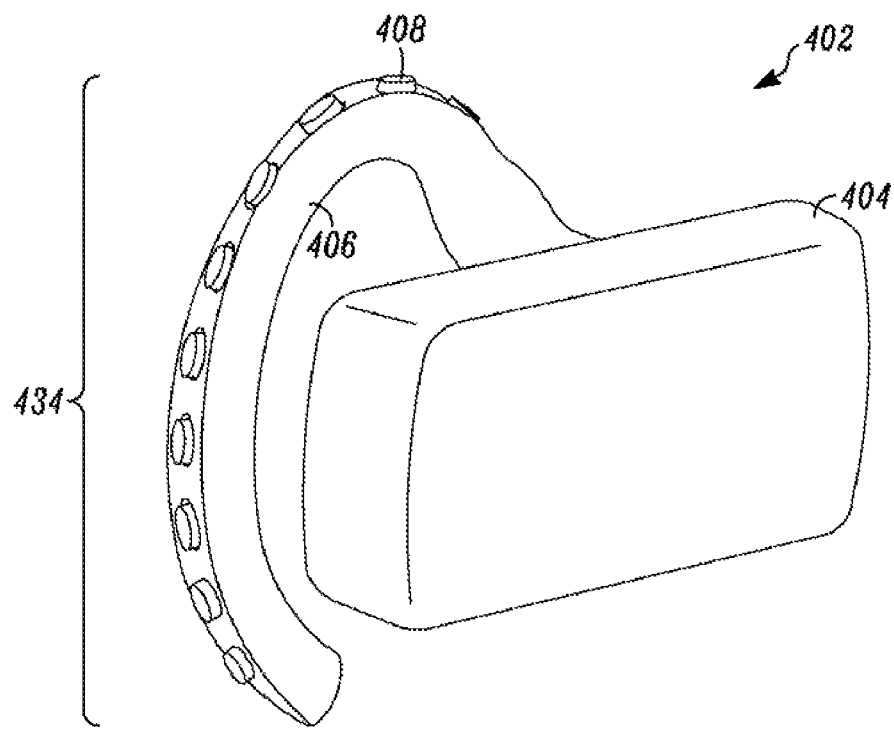
FIG. 4 shows an embodiment of a wearable electronic device having a keypad integral with an earmount.

As discussed above, the keypad housing 106 may have any configuration so that it is attached to the main housing 104. In the discussion to follow, FIGS. 2 and 3 show an embodiment of a wearable electronic device with a boom or slide, that may support a keypad as well as a microphone. FIG. 4 shows an embodiment of a wearable electronic device that may be supported against a user's head with an earmount. The earmount may serve to support an optical keypad.

FIG. 2 depicts an embodiment of a wearable electronic device 202 having a microphone boom 230 that may support a microphone 231. The microphone boom 230 is slidably attached to the main housing 204. It is understood that the microphone boom may be fixed, or rotatably and/or detachably connected to the main housing 204. Any manner of attachment between the microphone boom and the main housing 204 is within the scope of this discussion.

The electronic device 202 includes an optical keypad 208 integral with, and/or supported by, the slidable microphone boom 230. The boom 230 may be configured with two legs and an end crosspiece so as to define a U-shape that can be extended from the housing 204. A microphone 231 may be mounted on the end crosspiece, or on another portion of the boom distal the housing 204. The microphone boom 230 may include a keypad housing 206 that may be adjustable in position or orientation relative to the main housing 204. In one embodiment, the keypad housing 206 may be slidably coupled to the main housing 204 so as to define a slide. The keypad housing 206 may have a linear or a curvilinear profile. In the embodiment of FIG. 2, the optical keypad 208 is pictured on a slide. In another embodiment the optical keypad 208 may be mounted on a nonsliding portion.

A plurality of keys 210a, 210b may be disposed in consecutive positions or in a linear alignment along the keypad housing 206. One or more soft keys 232a, 232b may be included in the optical keypad 208. The soft keys 232a, 232b may be configured to be activated according to a position of the slide with respect to the main housing 204. In one embodiment, soft key 232a may be active when the boom 230 is in the fully extended position shown. There may be in addition another set of keys disposed along the opposite leg of the boom, including soft keys.

FIG. 3 depicts the embodiment of FIG. 2 showing the microphone boom 330 in a retracted position relative to the electronic device 302. The soft keys 332a, 332b may have a different functionality in this position than in the position shown in FIG. 2. In an embodiment all the keys of the optical keypad 308 may be active in the retracted position. In another embodiment a press of a soft key may activate the keypad when in the retracted position. In an embodiment, for example the soft key 332b may be active when the boom 330 is in the fully retracted position.

FIG. 4 shows an embodiment of a wearable electronic device 402 having a keypad 408 integral with an earmount 434. The earmount 434 may have any suitable shape, including an arcuate shape of an earhook or an earloop. The earmount 434 may be configured so that it includes an overhanging, lower, or extended portion and a hinge portion, the hinge portion coupling the earmount to the housing. The earmount may include a keypad housing 406 that may be adjustable in position or orientation relative to the main housing 404. It is understood that the embodiment of FIG. 4 may include a microphone boom as well. It is further understood that the embodiments of FIG. 2 and FIG. 3 may include an earmount configured to support the wearable electronic device 202 (see FIG. 2) or 302 (see FIG. 3).

The embodiments described above in connection with FIG. 2 and FIG. 3 are discussed below in connection with FIGS. 5 through 7. The embodiments described in connection with FIG. 4 are discussed below in connection with FIGS. 8 through 15.

Figure 5:
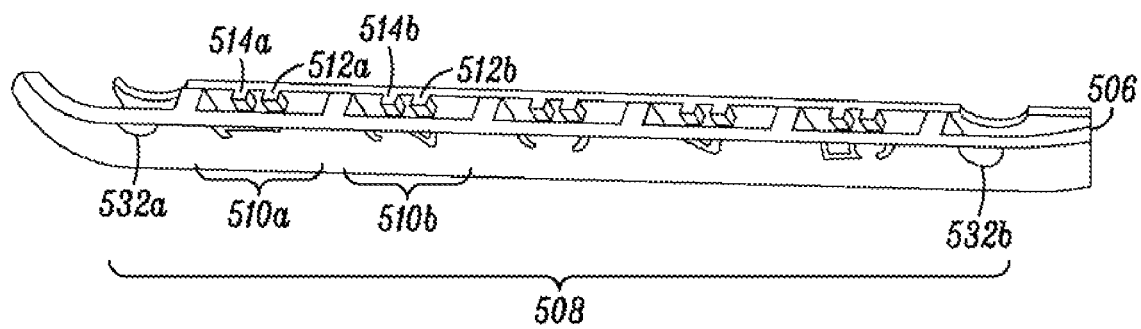
FIG. 5 depicts a cutaway view of a leg of the slidable microphone boom of the embodiment of FIG. 3.

FIG. 5 depicts a cutaway view of a leg of the slidable microphone boom 230 (see FIG. 2). The figure shows an embodiment where each key 510a, 510b and so on, have their own optical receivers 514a and 514b respectively. As mentioned above, the data connection 122 (see FIG. 1) may include an electrical connection between one or more optical receivers 114a, 114b in the keypad housing 106 and an analog-to-digital (A/D) converter 124 for example in the main housing 104.

Each key 510a, 510b and so on, may define a pocket or compartment. Within the compartment may be positioned for example an illumination source 512a and an optical receiver 514a. The components 512a, 514a, and so on, may be mounted on a flexible printed circuit (FPC) and each set may be mated to a single pocket or compartment corresponding to each number, as shown in the cutaway view. The soft keys 532a and 532b may be defined by openings in the slidable boom 230.

Briefly returning to FIGS. 2 and 3, an illumination source and an optical receiver for a soft key may be mounted on the housing 204 (see FIG. 2) below the position of soft key 232a. In this manner soft key 232a may be active when the boom is fully extended as in FIG. 2. When the boom is fully retracted as in FIG. 3, a soft key illumination source and optical receiver may be below the position of soft key 332b (see FIG. 3), and thus soft key 332b may be active when the boom is fully retracted.

Returning now to the discussion of FIG. 5, and as discussed above, each number on the keypad may have an illumination source and optical receiver nested into their respective compartment. Also, circular icons on each side, for example 232a, 232b (see FIG. 2), may designate the positions of the soft keys. As discussed above, the set of soft keys which can be active may depend on whether the slide is opened or closed. When closed, for example, the soft key below the number '5' may be active, when the slide is open the soft key above the number '1' may be active. Similarly, the opposite leg of the slide may support number keys 6-0 and two additional soft keys, with soft key activity controlled by boom or slide position in an analogous manner. It is understood that any number of soft keys may be included in the optical keypad.

The illumination sources and optical receivers for the soft keys may be in the main body. The illumination sources and optical receivers for the other keys may be in the keypad housing. The light from the illumination source for a number key may illuminate the number key. The light from the illumination sources for the soft keys may illuminate the soft key when it is active, so there would be a visual cue as to which soft keys are active.

A key of the keypad, for example 501a, may define an aperture or opening configured to allow light from a corresponding illumination source to escape the keypad housing to provide key illumination. Each key may be selected by covering the opening defined by that key, for example 510a. Covering the opening may result in light from the illumination source 512a being reflected back into the optical receiver 514a. That is, the key may be configured to be covered during a key press so that light from the corresponding illumination source is reflected to an associated optical receiver to signal the key press.

When selected, each number key of the keypad may register a different signal based on the intensity of the light reflected to its optical receiver. Thus, the emissions of the illumination sources may be coded according to intensity. The amount of light reflected can be controlled in a number of ways. Control of the amount of reflected light is discussed in connection with FIG. 6.

Figure 6:
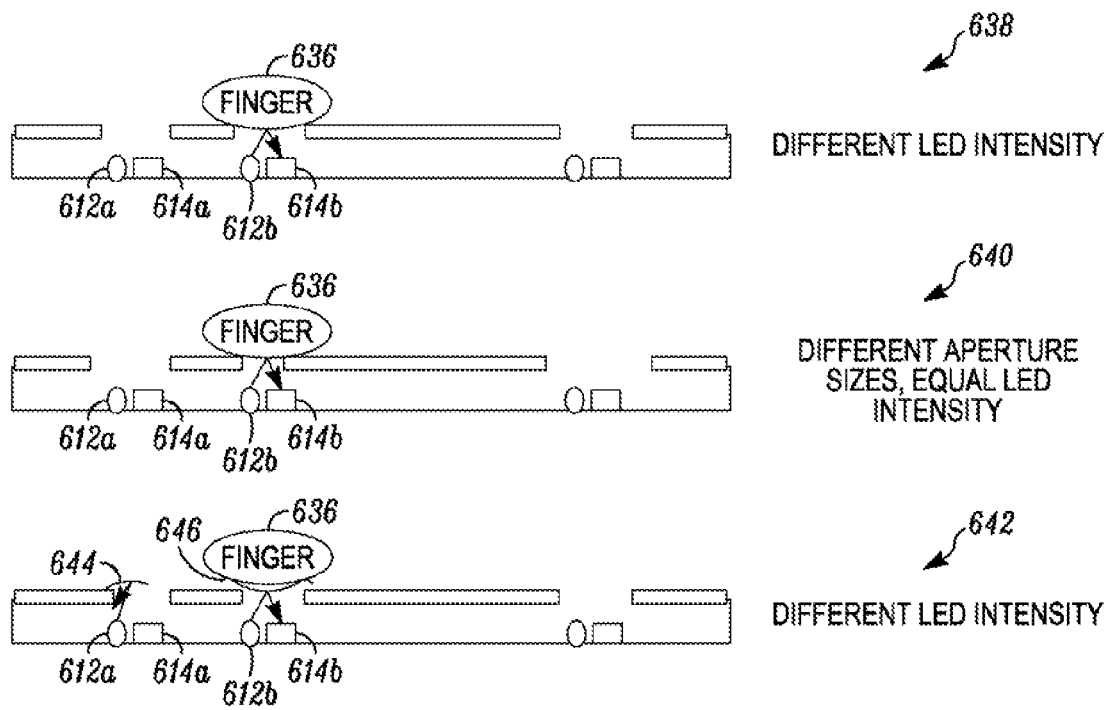
FIG. 6 depicts embodiments for three implementations of an optical keypad.

FIG. 6 depicts embodiments for three implementations of registering the light signal generated as a result of a key press on an optical keypad. As discussed above, the key may be selected by covering the opening or aperture defined by the key, for example, by a user's finger 636. In one implementation 638, the amount of light reflected may be controlled by varying the intensity of each illumination source for example, 612a vs. 612b. Control of the intensity of an illumination source may be accomplished for example by including an inline resistor with each illumination source 612a, 612b. The intensity of emission of the illumination source may be controlled by the value of the inline resistor, so that the illumination sources may have predetermined intensities of illumination. Each aperture or opening defined by each key of the plurality of keys may have the same size, so that the intensity of the light reflected to an optical receiver 614a vs. 614b may be controlled by the intensity of the illumination source.

A different implementation 640 to register the light signal generated as a result of a key press on an optical keypad may include that each illumination source may emit light with the same intensity. The amount of light reflected may be controlled by changing the size of the aperture or opening defined by each number key. In this implementation the need for inline resistors may be eliminated. In the embodiments 638 and 640, the keypad may be "trained" or otherwise calibrated to a user's finger presses.

Another embodiment 642 to register the light signal generated as a result of a key press on an optical keypad may include that standard metallic domes 644, 646, for example, can be used to reflect the light to or away from the optical receiver. A key, for example 510a, may be partly covered by the deformable dome 644, for example so as to define an aperture configured to allow light from a corresponding illumination source to escape the keypad housing 206 (see FIG. 2) to provide key illumination. By taking advantage of the curvature of the domes and how they "pop," light from an illumination source 612a, 612b may be reflected toward or away from the corresponding optical receiver 614a, 614b, respectively. That is, the dome may be configured to reflect light from a corresponding illumination source to an associated optical receiver to signal a key press. A benefit of this implementation may be the addition of tactile feedback to the user. Another benefit may be the ability to more consistently reflect light, that is, in a way which is not dependent on the user's finger characteristics (color, roughness, reflectivity, cloth, etc).

Figure 7:
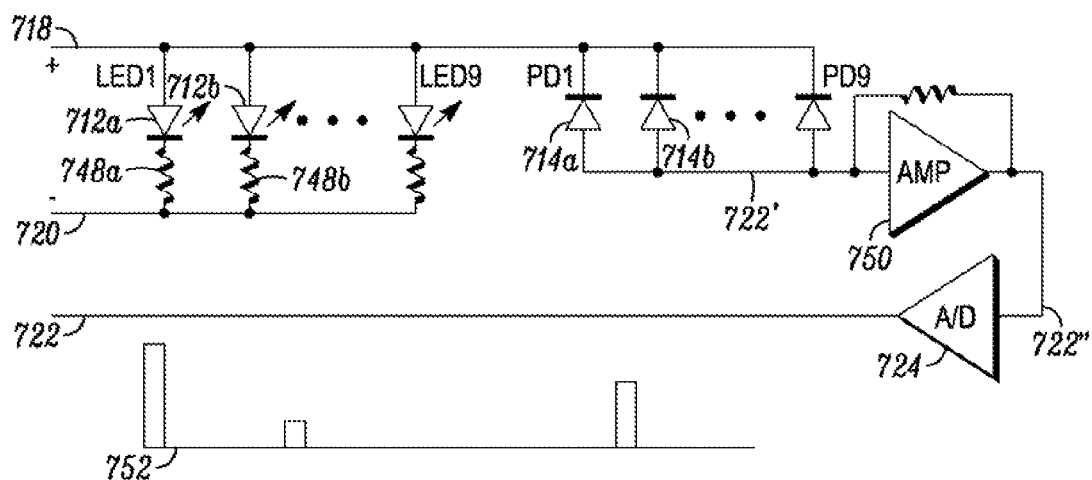
FIG. 7 shows an embodiment of a circuit for an optical keypad including illumination sources and sensors.

FIG. 7 shows an embodiment of a circuit for an optical keypad including illumination sources 712a, 712b and optical receivers 714a, 714b. Inline resistors 748a, 748b may be included to individually control the intensity of the illumination sources. As previously discussed, the illumination sources and optical receivers may be mounted on a flexible printed circuit (FPC) and each pair may be mated to a single pocket or compartment of the keypad housing 506 (see FIG. 5) corresponding to each number. There may be three electrical connections to the main housing 104 (see FIG. 1) including power 718, ground 720, and signal 722.

In the embodiment of FIG. 7, the illumination sources are shown as LEDs and the optical receivers are shown as photodiodes (PDs). As shown in the schematic representation, the LED-resistor pairs would all be in parallel, as would the optical receivers. The pocket or compartment associated with each number 510a, 510b (see FIG. 5) helps to isolate each LED-photodiode pair. The numbers themselves could be the aperture, that is, the aperture may be a cutout in the shape of its corresponding number. Alternatively or in addition, the slide or boom 230 (see FIG. 2) may include multiple parts where the numbers were pad-printed or etched on a translucent part which may be assembled to the slide or keypad housing.

As mentioned above, the optical receivers may be connected in parallel. Different transmitted light intensities are reflected back into individual diodes resulting in different corresponding amplifier 750 output voltage levels. The amplifier 750 may be a transimpedance (TZ) amplifier, and consequently the optical receivers may act as current sources connected in parallel. In this manner their output levels may be summed. These levels then may drive an analog-to-digital converter (A/D) 724 for key identification by the controller 126 (see FIG. 1). In an embodiment, the TZ amplifier 750 and the A/D converter 724 may be positioned in the main housing 104 (see FIG. 1), with connection 722''' as the data connection 122 of the keypad signal interface 116. In another embodiment, the TZ amplifier 750 may be positioned in the keypad housing 106 and the A/D converter 724 may be positioned in the main housing 104 (see FIG. 1), with connection 722'' as the data connection 122 of the keypad signal interface 116.

As just discussed in connection with FIG. 7, the data connection 122 (see FIG. 1) between the keypad housing 106 and the main housing 104 may be an electrical connection, such as for example, 722, 722', or 722''. In the embodiments discussed in connection with FIG. 4 above, the data connection 122 may be an optical connection. FIGS. 8 through 15 discuss features of embodiments in which the data connection 122 may be an optical data connection.

FIG. 8 depicts a cutaway view of a portion of the earmount 434 of the embodiment of FIG. 4 showing details of keys 810a, 810b, and 810c, for example, and an optical guide. The figure shows an embodiment of an optical keypad 808 where each key 810a, 810b and 810c and so on, share an optical receiver 114 (see FIG. 1) in the main housing. As discussed above, the data connection 122 may include an optical guide 128 that may be configured to gather an optical signal from a corresponding illumination source 112a, for example, for each of the plurality of keys, for example, 110a. The optical guide 128 may be configured to conduct the optical signal to the shared optical receiver in the main housing 104.

The optical keypad 808 may include a keypad housing 806, keys 810a, 810b, and 810c, a bendable optical guide 828, and a flexible printed circuit (FPC) 858. An illumination source such as a side-shoot LED or laser 812a, for example, may be mounted on the FPC, corresponding to each key. The FPC 858 may define a hole corresponding to each key, for example hole 860 corresponding to key 810a, to allow for key depression through the FPC 858.

Figure 9:
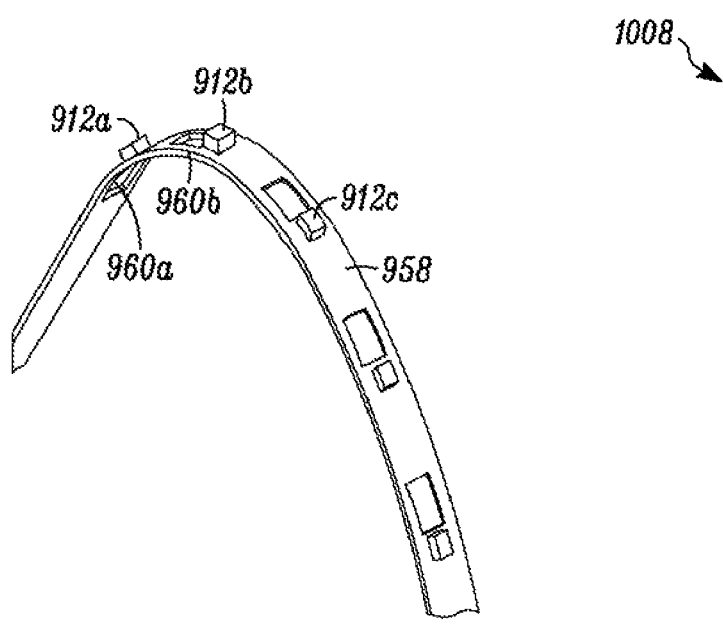
FIG. 9 depicts an embodiment of a flexible printed circuit including illumination sources.

FIG. 9 depicts an embodiment of a flexible printed circuit including illumination sources. The illumination sources 912a, 912b, 912c, and so on, may be placed on a one layer FPC 958. The FPC 958 may have openings in it 960a, 960b, 960c, for example, for key insertion during key press.

Figure 10:
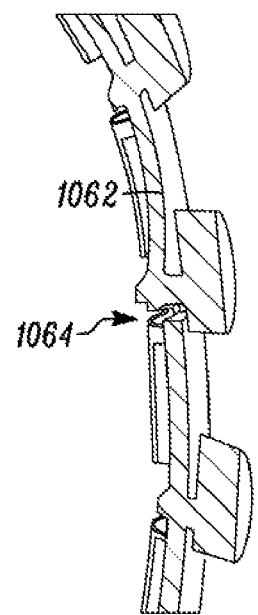
FIG. 10 shows an embodiment of keys and an optical guide for an optical keypad.

FIG. 10 shows an embodiment of keys and an optical guide for an optical keypad 1008, with a further break down in the keypad construction. An exterior surface 1062 of the keypad 1008 may be rubber, to conform with the flexibility of the optical guide 828 (see FIG. 8). An approximately 45-degree reflector 864 and 1064 may provide for key illumination when a key is not pressed.

Returning to FIG. 8, when a key 810b is pressed, the bendable optical guide 828 may bend down to momentarily align with the illumination source 812b of the pressed key for optical coupling. The single bendable optical guide 828 may include multiple deformable segments, with a deformable segment corresponding to each of the plurality of keys 810a, 810b, 810c, as shown. All couplings from the various keys 810a, 810b, 810c, and so on, may provide optical input to the same single bendable optical guide 828, to be directed toward the main housing 104 (see FIG. 1) of the wearable device 102 where the optical receiver 114 may be located. In this manner the optical guide 828 may be configured to gather an optical signal from a corresponding illumination source for each of the plurality of keys 810a, 810b, 810c, and so on, and may be configured to conduct the optical signal to the main housing 104.

When none of the keys are pressed, light from each illumination source is aligned with an approximately 45 degree reflecting edge 864 to reflect light toward the exterior surface 1062 (see FIG. 10) of the keypad 808 for overall keypad illumination. When a key is pressed down, the approximately 45 degree portion 864 goes through the hole 960b (see FIG. 9) in the FPC 958 and the optical guide aligns with the illumination source allowing for light passage toward the optical receiver 114 (see FIG. 1). To accomplish both keypad illumination and data communication, visible LEDs and p-type-intrinsic-n-type (PIN) diodes without daylight filters may be used. Eliminating the daylight filter may not add noise since this is a dark room implementation, that is, the coupled light is internal to the keypad housing 806. Alternatively, two side by side LEDs (IR and visible) pointed in the same direction can be used. Also, multi-color LEDs controlled by key presses can be used where visible output is selected when key is not pressed and IR output is selected when key is pressed.

To provide improved tactile feedback to a user, a semi-bent metal piece may be added under the hole in the FPC for each key. The metal piece may function similarly to a standard popple. With proper design standard popples may instead be used. Moreover, the exterior surface 1062 (see FIG. 10) of the optical keypad 808 may include a tactilely coded location, for example a raised or ridged portion, corresponding to, or associated with a key.

When light is directed toward the exterior surface 1062 (see FIG. 10) to provide keypad illumination for an unpressed key, a deformable segment 828 (see FIG. 8) may direct light toward the exterior surface proximal a tactilely coded location for the corresponding key. When a key is pressed, the deformable segment may flex to direct light from the corresponding illumination source toward the main housing 104 (see FIG. 1).

Figure 11:
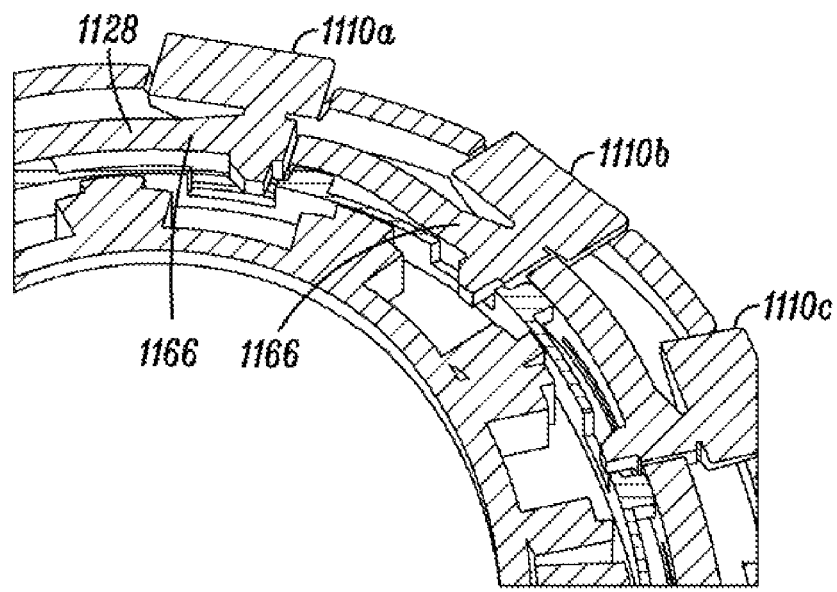
FIG. 11 depicts a cutaway view of a portion of the earmount of the embodiment of FIG. 4 showing fan out of an optical guide to support multiple key presses.

FIG. 11 depicts a cutaway view of a portion of the earmount of the embodiment of FIG. 4 showing fan out 1166 of an optical guide 1128 to support multiple key presses. With a configuration including a funnel geometry for optical guide fan out, light from other illumination sources may pass through and along the optical guide 1128 even in the area of a pressed key, so as to allow for detection of multiple key presses. For example, were key 1110c pressed as well as key 1110b, light signaling the press of key 1110c may still pass through the optical guide 1128 to arrive at the optical receiver 114 (see FIG. 1). In this manner at least one deformable segment is configured to mechanically enable multiple key presses by defining a funnel geometry to capture light from an adjacent segment and direct light from the adjacent segment toward the main housing.

As discussed above, optical receiver 114 (see FIG. 1) may be positioned in the main housing 104, with optical guide 1128 forming a data connection 122 as a part of the keypad signal interface 116. In the embodiments discussed in connection with FIG. 4, including those just discussed, the optical keypad 408 (see FIG. 4) may be positioned in an earmount 434 that may be rotatably and detachably connected to the main housing 404. Details of the keypad signal interface 116 associated with the earmount 434 are discussed in connection with FIG. 12.

Figure 12:
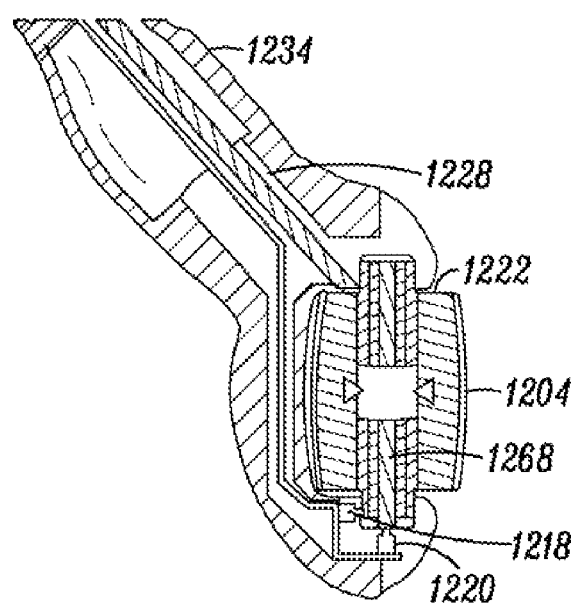
FIG. 12 depicts a cutaway view of a portion of the earmount of the embodiment of FIG. 4 showing a keypad signal interface.

FIG. 12 depicts a cutaway view of a portion of the earmount 1234 of the embodiment of FIG. 4. The earmount 1234 may be rotatably and detachably connected to the main housing 104 (see FIG. 1) at a portion 1204 of the main housing. The earmount 1234 may be detached and reattached for example to provide for right ear use or left ear use of the wearable electronic device 102.

FIG. 12 shows details of a keypad signal interface 116 (see FIG. 1). The keypad signal interface may include a power connection 1218 and a ground connection 1220. The power connection 1218 may couple with a hub of a spindle 1268. The ground connection 1220 may couple with a sleeve of the spindle 1268. In this manner, the earmount may provide power and ground connections whether the earmount is connected for right ear use or for left ear use. In another embodiment, the power connection 1218 may couple with the sleeve of the spindle 1268, while the ground connection 1220 may couple with the hub of the spindle 1268. It is understood that any suitable configuration of power and ground connections that may provide for right ear use and left ear use in a rotatable and/or detachable earmount is within the scope of this discussion.

The optical guide 1228 may couple to a corresponding portion 1222 of an optical guide surrounding the spindle to form a data connection 1222. Power connection 1218, ground connection 1220, and data connection 1222 form the three connections that make up the keypad signal interface 116 (see FIG. 1). The optical receiver may be located in the main housing 104 via optical coupling between the earmount 1234 and the main housing 1204. The optical receiver may be a photodiode, as previously discussed, and may be placed at the input of a transimpedance preamplifier for signal amplification. In order to determine which key is pressed, time division multiplexing may be used. In an alternative embodiment, a frequency counter may be employed. Each of these techniques is discussed below in connection with FIGS. 13 and 14, respectively.

Figure 13:
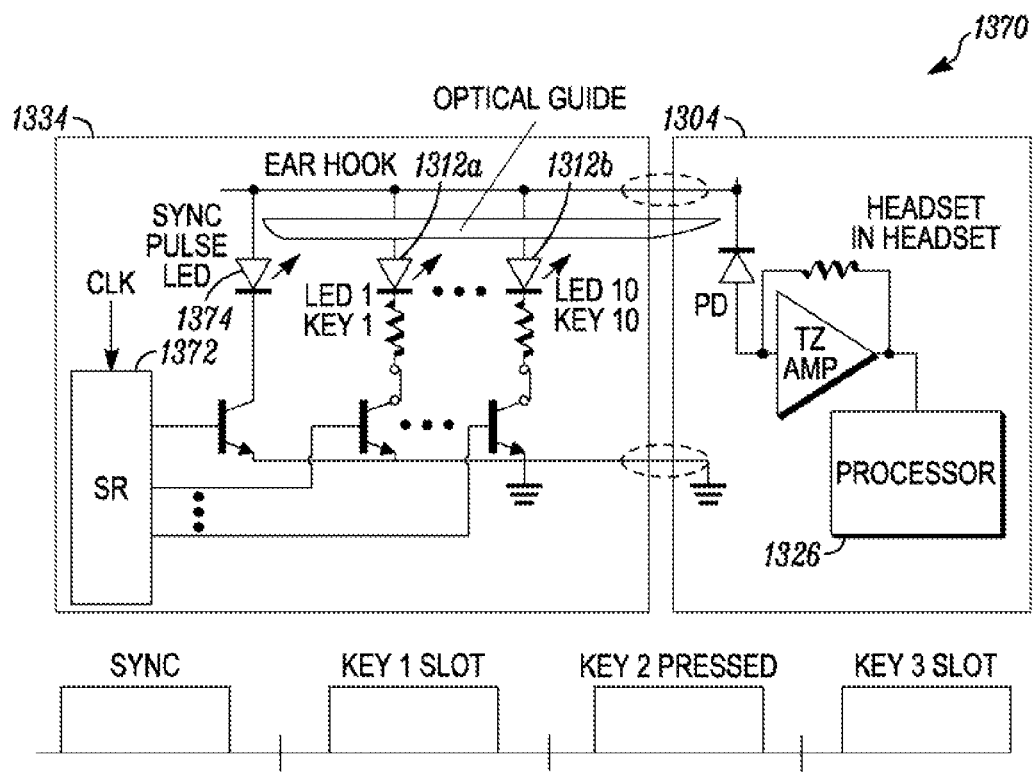
FIG. 13 shows an embodiment of a circuit for an optical keypad including illumination sources and sensors.

FIG. 13 shows an embodiment of a circuit 1370 using time division multiplexing for an optical keypad including illumination sources and sensors. Thus, the emissions of the illumination sources may be coded according to a time division multiplexing scheme. For the time division multiplexing scheme, a shift register 1372 in the earmount 1334 may be used with a synchronization pulse provided for example, by a blue LED 1374. The blue LED 1374 is always pulsing to indicate start of sequence while the illumination sources for the keys, for example, red LEDs 1312*a* and 1312*b*, may light up in their respective time slots only. The signal driving the key LED could be a DC continuous signal (for simplicity) or pulsed with a low duty cycle signal for power saving. In the case of a pulsed LED signal, a clock may be generated internal to the earmount 1334, for example, by an oscillator or a crystal. The LED currents may be DC currents. The controller or processor 1326 in the main housing 1304 may determine the presence or absence of received light within the specific time slots. In this manner multiple key presses may be detected, since the time slots may be much shorter/faster than finger speed. As previously discussed, the optical guide 1128 (see FIG. 11) may include a funnel geometry or a fan out configuration to accommodate detection of multiple key presses.

Figure 14:
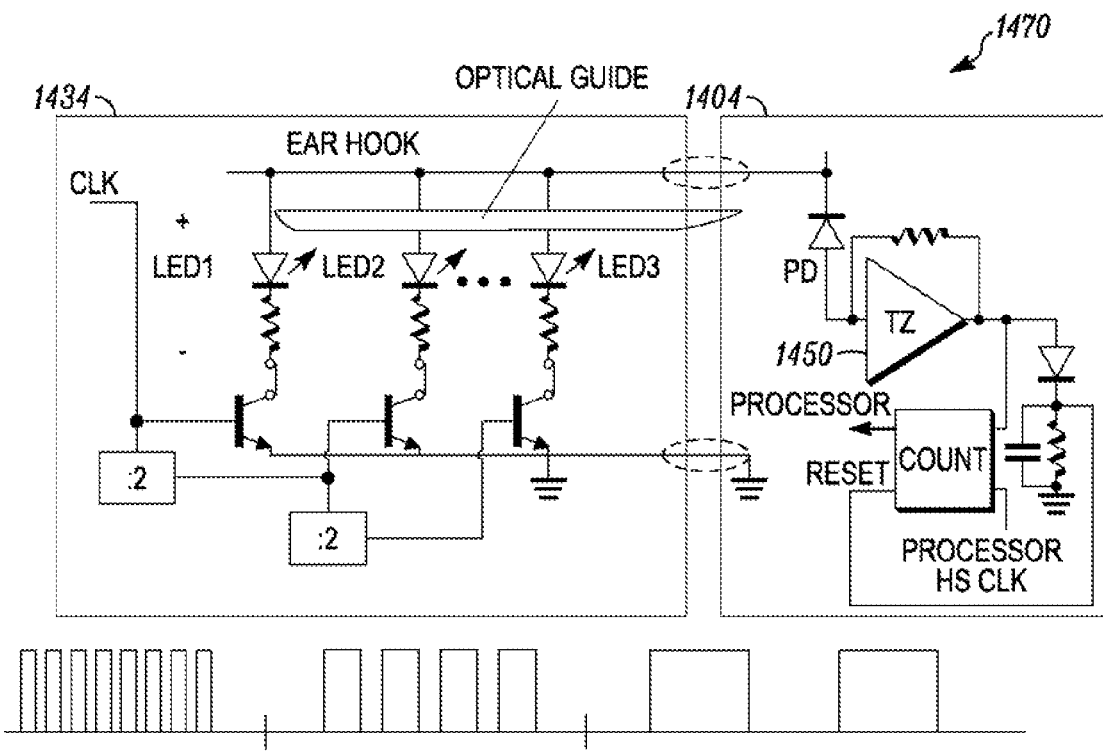
FIG. 14 shows another embodiment of a circuit for an optical keypad including illumination sources and sensors.

FIG. 14 shows another embodiment of a circuit 1470 for an optical keypad including illumination sources and sensors. The embodiment of FIG. 14 may rely on transmitting different frequencies for each LED. Thus, the emissions of the illumination sources may be coded according to a frequency division multiplexing scheme. In an embodiment a high speed clock along with divide-by logic for each key in the earmount 1434 may provide individual frequencies for each key. The clock signals may be received in the main housing 1404 using an optical receiver 1414, such as, for example, a photodiode, coupled to a transimpedance amplifier 1450. The output may be applied to a frequency counter and then to the processor or controller 126 (see FIG. 1). The frequency counter may start to count on the arrival of the first clock cycle (due to any key press). An envelope detector may start to form a gating signal indicating the presence of clock data. When the gating signal goes to zero (no incoming clock), the counter may be reset.

Figure 15:
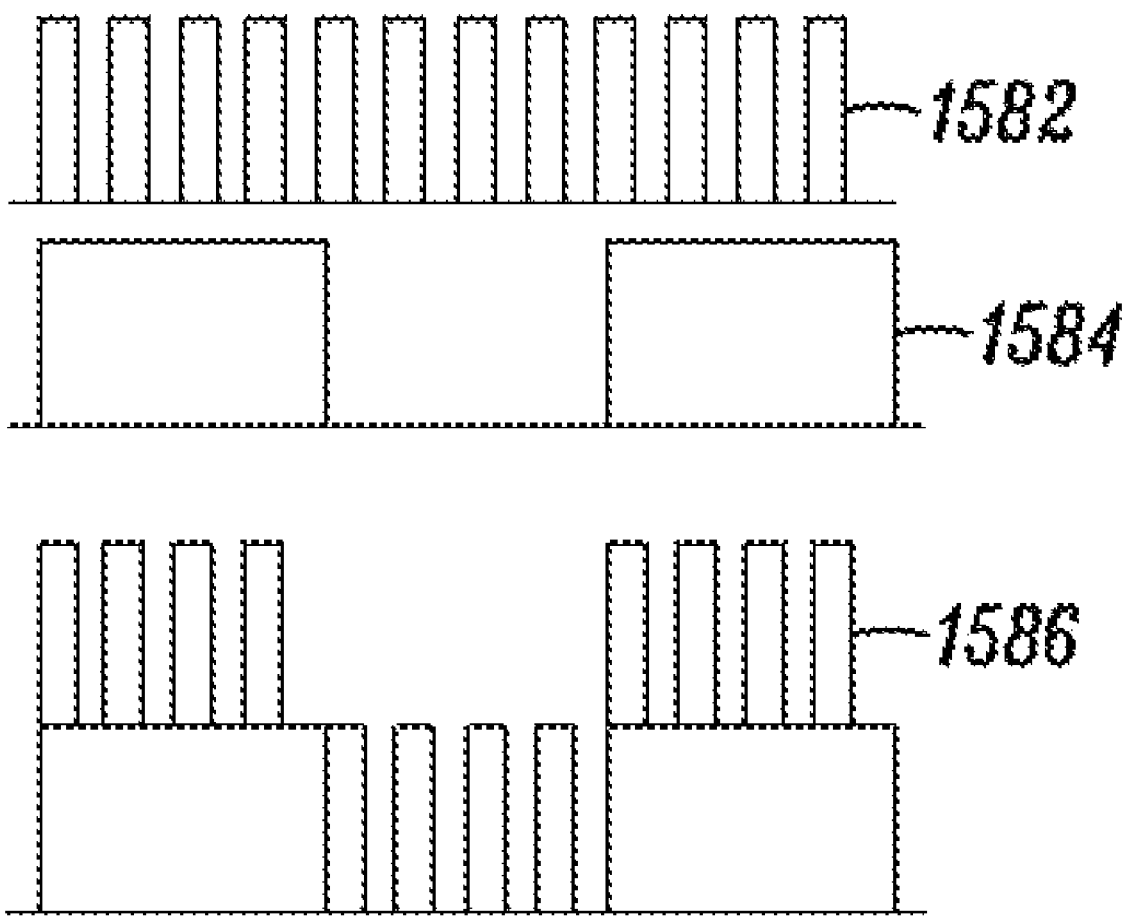
FIG. 15 depicts multiple simultaneous key presses according to an embodiment.

Multiple key presses are detectable as shown in FIG. 15, in which the high speed clock may be counted during the low bit time of the slower clock. The pulses 1582 corresponding to a press of a first key may be driven according to a high speed or high frequency clock. The pulses 1584 corresponding to a press of a second key may be driven according to a slower clock, for example, at one quarter the rate of the clock of 1582. When the first key and second key are pressed at the same time, the optical pulses from each key may be combined in the optical guide 1128 (see FIG. 11) due to the fan out geometry. The combination of the two key presses is shown by the pulses 1586. A pulse counter adapted to count pulses in combinations as shown at 1586, as well as pulses corresponding to a press of a single key, may provide for detection of multiple key presses. Moreover, averaging over a suitable number of pulse trains may be applied for consistent counts. Clocks can also be selected so that for example, they are recoverable from multi key presses such as prime number divisions, and so on.

It may be beneficial to utilize non-traditional surface area for a keypad, particularly when the surface area of a device is limited. The linear or curvilinear earmount housing of an earmounted headset or cellular telephone, for example, may support a keypad. In another embodiment, in an earmounted headset or cellular telephone, the linear or curvilinear microphone boom may support a keypad. A keypad in either of these particular embodiments may be linear or curvilinear. The keypad may be supported by a keypad housing that is separate from but attached to the main housing. In this way, surface area of the device may be conserved. In such a configuration, it may be beneficial if the keypad signal interface were limited to, for example, three connections to simplify the electronics of the device. Fewer electronic connections may not only help reduce the size of the device but may also help reduce the cost of the device.

Disclosed is an electronic device including a main housing 104 (see FIG. 1) and a keypad housing 106 attached to the main housing. The keypad housing 106 may be capable of adjustment in position or orientation relative to the main housing 104, and may support an optical keypad 108. In one embodiment, the keypad housing 106 may be an earmount 434 (see FIG. 4) for a wearable communication device. In another embodiment, the keypad housing 106 may be a microphone boom 230 (see FIG. 2).

This disclosure is intended to explain how to fashion and use various embodiments in accordance with the technology rather than to limit the true, intended, and fair scope and spirit thereof The foregoing description is not intended to be exhaustive or to be limited to the precise forms disclosed. Modifications or variations are possible in light of the above teachings. The embodiment(s) was chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally and equitably entitled.

The invention claimed is:

1. An electronic device, comprising:
a main housing;
a keypad housing attached to the main housing and adjustable in position or orientation relative to the main housing;
a plurality of keys disposed along the keypad housing;
a plurality of illumination sources, a corresponding illumination source for each of the plurality of keys;
an optical receiver configured to be optically coupled to at least one of the plurality of illumination sources, and configured to convert a received optical signal representing data into an electrical signal representing data; and
a keypad signal interface electrically connected to the keypad housing, the keypad signal interface including a connection for data between the keypad housing and the main housing, and the connection for data is an electrical connection configured as a data line,
wherein the optical receiver comprises a plurality of optical receivers associated with the plurality of keys, the optical receivers positioned in the keypad housing and providing outputs in response to optical signals, and connected to the data line so that outputs of the plurality of optical receivers are summed to generate a summed output.

2. The device of claim 1, wherein the device is a wireless communication device.

3. The device of claim 1, wherein:
the keypad housing has a linear or curvilinear profile; and
the plurality of keys are disposed in consecutive positions along the keypad housing.

4. The device of claim 1, wherein the keypad housing is slidably coupled to the main housing so as to define a slide, and at least one key of the plurality of keys is configured as a soft key and configured to be activated according to a position of the slide with respect to the main housing.

5. The device of claim 1, wherein the keypad signal interface consists of:
an electrical connection for power between the keypad housing and the main housing; and
an electrical connection for ground between the keypad housing and the main housing.

6. The device of claim 1, wherein:
at least one key of the plurality of keys defines an aperture configured to allow light from a corresponding illumination source to escape the keypad housing to provide key illumination; and
the at least one key of the plurality of keys is configured to be covered during a key press so that light from the corresponding illumination source is reflected to an associated optical receiver to signal the key press.

7. The device of claim 1, wherein:
at least one key of the plurality of keys is partly covered by a deformable dome so as to define an aperture configured to allow light from a corresponding illumination source to escape the keypad housing to provide key illumination;
the dome is configured to reflect light from the corresponding illumination source to an associated optical receiver to signal the key press;
the illumination sources of the plurality of illumination sources have predetermined intensities of illumination; and
the summed output is provided as input to an analog-to-digital (A/D) converter.

8. The device of claim 1, wherein:
the connection for data comprises an optical guide configured to gather an optical signal from a corresponding illumination source for each of the plurality of keys and configured to conduct the optical signal to the main housing; and
the optical receiver is positioned in the main housing and coupled to the optical guide.

9. The device of claim 8, wherein:
the keypad housing has an exterior surface; and
the optical guide includes at least one deformable segment configured to guide light toward the exterior surface of the keypad housing for key illumination, and configured to guide light toward the main housing for key press detection.

10. The device of claim 9, wherein:
the optical guide includes a deformable segment for each key of the plurality of keys;
the deformable segment is configured so that when the key is not pressed, the deformable segment directs light from a corresponding illumination source toward the exterior surface of the keypad housing proximal a tactilely coded location associated with the key, so that the key is illuminated;
at least one deformable segment is configured to direct light from an adjacent segment toward the main housing; and
the deformable segment is configured so that when the key is pressed, the deformable segment flexes to direct light from the corresponding illumination source toward the main housing.

11. The device of claim 8, wherein:
the optical guide includes a deformable segment for each key of the plurality of keys;
the deformable segment is configured so that when the key is pressed, the deformable segment flexes to direct light from the corresponding illumination source toward the main housing; and
at least one deformable segment is configured to mechanically enable multiple key presses by defining a funnel geometry to capture light from an adjacent segment and direct light from the adjacent segment toward the main housing.

12. The device of claim 8, wherein:
at least one illumination source is configured to generate emissions coded according to a time division multiplexing (TDM) scheme or a frequency division multiplexing (FDM) scheme.

* * * * *